(12) United States Patent
Wong-Campos et al.

(10) Patent No.: US 11,146,271 B2
(45) Date of Patent: Oct. 12, 2021

(54) FLEXIBLE TOUCH SENSORS AND METHODS FOR WIDE-FIELD IMAGING OF ATOM OR ION TRAP

(71) Applicant: IonQ, Inc., College Park, MD (US)

(72) Inventors: Jaime David Wong-Campos, Hyattsville, MD (US); Phillip Douglas Solomon, Washington, DC (US); Jason Madjdi Amini, Takoma Park, MD (US); Kai Hudek, Hyattsville, MD (US)

(73) Assignee: IONQ, INC., College Park, MD (US)

( * ) Notice: Subject to any disclaimer, the term of this patent is extended or adjusted under 35 U.S.C. 154(b) by 82 days.

(21) Appl. No.: 16/730,449

(22) Filed: Dec. 30, 2019

(65) Prior Publication Data

US 2020/0220546 A1   Jul. 9, 2020

Related U.S. Application Data

(60) Provisional application No. 62/789,921, filed on Jan. 8, 2019.

(51) Int. Cl.
*G06N 10/00* (2019.01)
*H03K 17/96* (2006.01)

(52) U.S. Cl.
CPC ......... *H03K 17/9627* (2013.01); *G06N 10/00* (2019.01)

(58) Field of Classification Search
CPC .......................... H03K 17/9627; G06N 10/00
USPC ....................................................... 250/505.1
See application file for complete search history.

(56) References Cited

U.S. PATENT DOCUMENTS

| 2019/0027355 A1* | 1/2019 | Kim | ................... B81B 7/0041 |
| 2020/0028311 A1* | 1/2020 | Hudek | ................... G02B 27/10 |

* cited by examiner

*Primary Examiner* — Tomi Skibinski
(74) *Attorney, Agent, or Firm* — Arent Fox LLP

(57) ABSTRACT

The disclosure describes various aspects of different techniques for flexible touch sensors and method for wide-field imaging of an atom or ion trap. A touch sensor is described for controlling movement of a control element for use with the trap that includes an outer structure and an inner structure that holds the control element and moves within the outer structure. The trap is inside an ultra-high vacuum (UHV) environment and the outer and inner structures are outside the UHV environment and separated by a UHV window. The control element or elements are brought into proximity of the UHV window in connection with controlling targets at the trap. The inner structure can stop moving within the outer structure to avoid damaging of the UHV window with the control element(s) in response to the inner structure being in physical contact with or within a set proximity of the outer structure.

32 Claims, 12 Drawing Sheets

FLEXIBLE TOUCH SENSORS AND METHODS FOR WIDE-FIELD IMAGING OF ATOM OR ION TRAP

CROSS REFERENCE TO RELATED APPLICATION

The present application claims priority to and the benefit from U.S. Provisional Patent Application No. 62/789,921, entitled "FLEXIBLE TOUCH SENSORS AND METHOD FOR WIDE-FIELD IMAGING OF ATOM OR ION TRAP," and filed on Jan. 8, 2019, the contents of which are incorporated herein by reference in their entirety.

BACKGROUND OF THE DISCLOSURE

Aspects of the present disclosure generally relate to imaging or illumination of surface ion traps and, more specifically, to the use of sensors, including flexible touch-down sensors, in connection with imaging optics as well as methods for wide-field imaging of an atom or ion trap.

In some quantum information processing (QIP) systems that rely on trapped ion technology, the use of high numerical aperture (high-NA) light collection and imaging of ions and atoms, which is highly desirable in atomic physics for various reasons, requires very precise alignment, short working distances, and large optics. In surface ion traps, the regions of interest (ROI) are determined by the trap and can be separated by several millimeters, much greater than the field-of-view (FOV) of the high-NA optics. This typically means that the optics need to be placed outside of vacuum and actively aligned and scanned because the precision of the optics and the FOV is much tighter than the errors associated with the fabrication and assembly of the trap and associated mounting structure.

Due to various factors, including the constraints associated with being close to the ions in the trap, the high-NA optics are tightly constrained with very tight tolerances and a high probability for catastrophic failure if the optics are moved out of bounds and cause a collision.

Accordingly, techniques are desirable that can provide a way to bound the high-NA optics to prevent collisions that can damage expensive and/or fragile components and thereby prevent possible system failures. Techniques that enable the accurate determination of the ROIs in the trap are also desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a touch sensor for controlling movement of one or more control elements for use with an atom or ion trap is described that includes an outer structure and an inner structure configured to hold the optics and to move within the outer structure. The atom or ion trap is placed inside an ultra-high vacuum (UHV) environment, and the outer structure and the inner structure are placed outside the UHV environment and separated from the UHV environment by an UHV window (such as an optical window), the inner structure with the one or more control elements being brought into proximity of the UHV window in connection with control (e.g., imaging, illumination) of one or more targets at the atom or ion trap. The outer structure and the inner structure are configured such that the inner structure stops moving within the outer structure to avoid damaging of the UHV window with the one or more control elements and in response to the inner structure being in physical contact with or within a set proximity of the outer structure.

In another aspect of the disclosure, a method for controlling movement of one or more control elements for use with an atom or ion trap is described that includes moving an inner structure having the one or more control elements within an outer structure, wherein the atom or ion trap is placed inside a UHV environment, and the outer structure and the inner structure are placed outside the UHV environment and separated from the UHV environment by a UHV window, the inner structure with the one or more control elements being brought into proximity of the UHV window in connection with control of one or more targets at the atom or ion trap. The method further includes detecting whether the inner structure is in physical contact or within a set proximity of the outer structure, and stopping movement of the inner structure within the outer structure to avoid damaging of the UHV window with the one or more control elements and in response to detecting that the inner structure is in physical contact with or within a set proximity of the outer structure.

For the touch sensor and/or the method described above, the one or more control elements may include one or more of one or more optical elements, one or more microwave antennas, or one or more compensating magnets. Moreover, when the one or more control elements include one or more optical elements, control of the one or more targets may involve one or both of imaging of the one or more targets using the one or more optical elements, applying control optical beams to the one or more targets using the one or more optical elements. The atom or ion trap may be a surface trap, a three-dimensional (3D) ion trap, or an optical trap.

In another aspect of the disclosure, a touch sensor for controlling movement of one or more control elements for use with an atom or ion trap is described that includes a holder configured to hold the one or more control elements and to move with respect to the atom or ion trap, wherein the atom or ion trap is placed inside an UHV environment, and holder is placed outside the UHV environment and separated from the UHV environment by a UHV window, the holder with the one or more control elements being brought into proximity of the UHV window in connection with control of one or more targets at the atom or ion trap; and a flexible circuit board that is ring-shaped and placed on an end of the holder closest to the UHV window, the flexible circuit board having one or more resistive or capacitive rings that change value in response to the one or more control elements being in physical contact with or within a set proximity of the UHV window.

Each of the aspects described above is described in connection with quantum information processing (QIP) systems, however, each of these aspects can be applicable to other systems in which precise and proximate positioning of optics may be desirable.

BRIEF DESCRIPTION OF THE DRAWINGS

The appended drawings illustrate only some implementation and are therefore not to be considered limiting of scope.

DETAILED DESCRIPTION

Figure 1A:
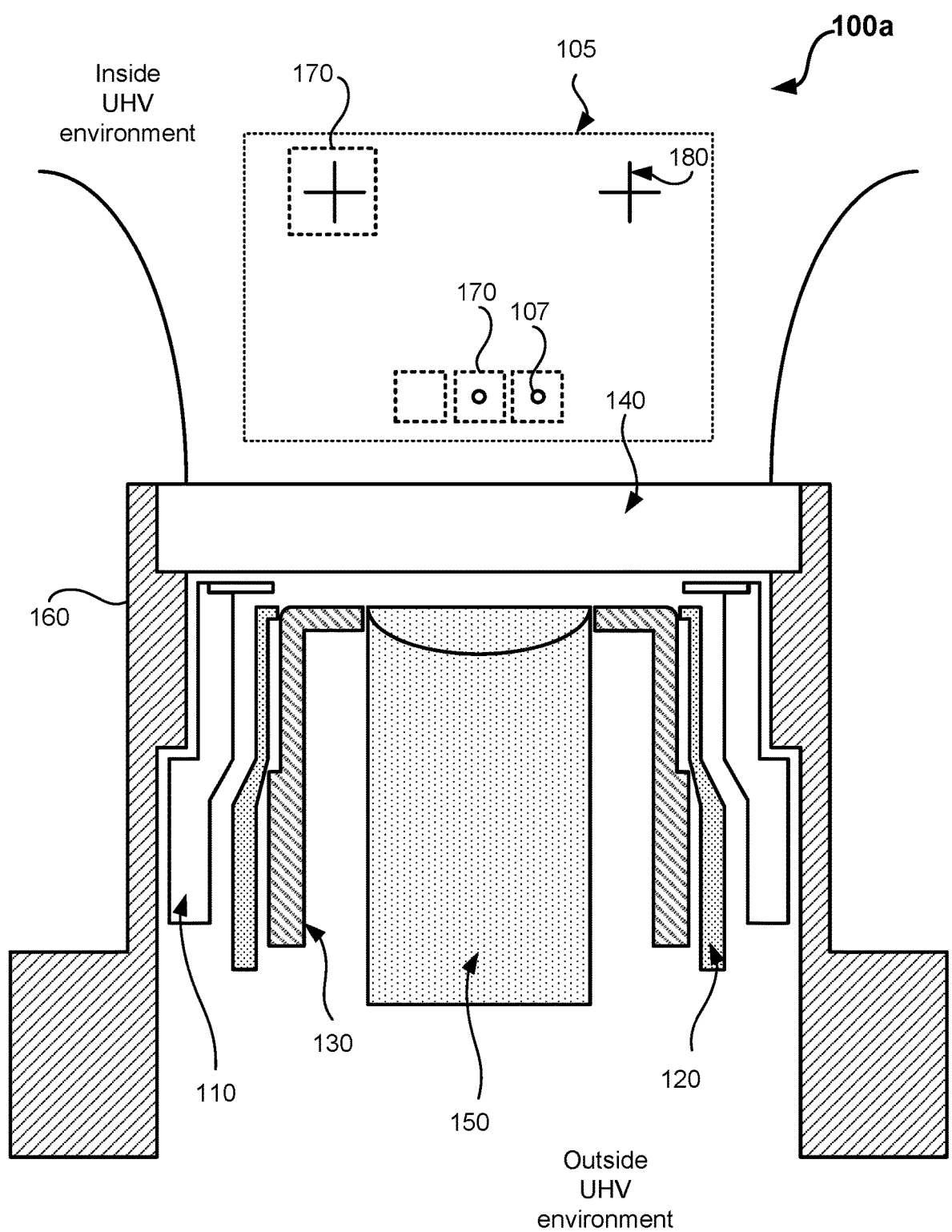
FIG. 1A illustrates a cross sectional view of an example of a system that interacts with an atom or ion trap, in accordance with aspects of the disclosure.

Reference will now be made in detail to example aspects of implementations, examples of which are illustrated in the accompanying figures. The following description refers to the accompanying figures in which the same numbers in different figures represent the same or similar elements unless otherwise represented. The implementations set forth in the following description do not represent all implementations consistent with the disclosure. Instead, they are merely examples of structures and/or processes consistent with aspects of implementations related to the disclosure as recited in the claims.

As mentioned above, in atomic physics, and in particular in QIP systems, it is important to place certain control elements, such as expensive optical elements (e.g., lenses) quite close to sensitive or fragile optical components (e.g., optical windows) while having the ability to move or scan the element and avoiding collisions that can damage the optical components.

The present disclosure solves the problem of defining the bounding area for the range of movement of the control elements in question, preventing a collision and subsequent possibility of failure, as well as adding wide-field illumination for accurate determination of position of the optics with respect to the regions or targets of interest. In one implementation, which is described in more detail below with respect to FIGS. 1A-2C, the present disclosure describes the use of an inner structure and outer structure that, when contacted or brought within a set proximity, will trigger a shutdown of the relative motion of the optics by, for example, closure of an electronic circuit and prevent a collision.

Alternatives for such system can include the use of flexible circuit boards with resistive or capacitive rings that wrap the optical element (e.g. lens) and change values upon contact with spring loaded pins or buttons, which is described in more detail below with respect to FIGS. 3A, 3B, and 3C.

Moreover, in order to provide wide-field illumination for accurate determination of position of the optics, a set of diffused light emitting elements (e.g., light emitting diodes or LEDs) can be installed on an inner radius of a touch sensor or are integrated into the flexible circuit to illuminate the ion trap, providing camera based detection schemes for collision prevention and alignment to registration marks and/or features of the atom or ion trap. These aspects are described in more detail below with respect to FIG. 4.

Trapped atoms may be used to implement quantum information processing, although some QIP systems can be implemented using other technologies such as superconducting technologies. Atomic-based qubits can be used as different type of devices, including but not limited to quantum memories, the quantum bits in quantum computers and simulators, and nodes for quantum communication networks. Qubits based on trapped atomic ions (e.g., atoms with a net state of electrical charge) can have very good coherence properties, can be prepared and measured with nearly 100% efficiency, and can be readily entangled with each other by modulating their Coulomb interaction or remote photonic interconnects. As used in this disclosure, the terms "atoms," "atomic ions," and "ions" may be used interchangeably to describe the particles that are isolated and controlled, or are actually confined, in a trap to form a lattice or similar arrangement or configuration. Where the charge state of the atom (neutral atom or any charge state of the atomic ion) is not relevant, the disclosure describes techniques that can be used for any type of neutral atom or atomic ion or other type of optically active quantum system.

In the case of atomic ions, the typical ion trap geometry or structure used for quantum information and metrology purposes is the linear radio-frequency (RF) Paul trap (also referred to as an RF trap, a Paul trap, or simply a trap), where nearby electrodes hold static and dynamic electrical potentials that lead to an effective inhomogeneous harmonic confinement of the ions. This type of trap uses electric fields to trap or confine charged particles in a particular region, position, or location. Atom or ion traps can include a surface trap, a three-dimensional (3D) ion trap, or an optical trap.

As mentioned above, high numerical aperture (high-NA) optics are used in light collection and imaging of ions and atoms in a trap, and this requires very precise alignment, short working distances, and large optics, which can cause collisions between the optics and the delicate optical components. Described below are various techniques for bounding the range of movement of the high-NA optics to prevent collision as well as adding wide-field illumination for alignment and imaging.

FIG. 1A shows a diagram 100a that illustrates a cross sectional view of an example of a system that interacts with an atom or ion trap to, for example, provide light collection and imaging of the atom or ion trap. The system may be referred to as a touch sensor, touchdown sensor, or a touch(down) sensing system, for example. The diagram 100a shows an atom or ion trap 105 that is housed within a ultra-high vacuum (UHV) environment in a chamber (not shown) and can include multiple trapped atoms or ions 107 that are used for performing various quantum operations or computations. An example of such a chamber can be a chamber 550 described below in connection with FIG. 5.

The trapped ions 107 are therefore inside the UHV environment provided by the vacuum chamber. Separating the UHV environment and regions outside the UHV environment is a UHV window 140 that is supported by a supporting structure 160. The supporting structure 160 can be, for example, a wall or part of a wall of a vacuum chamber or other structure associated with a vacuum chamber. The UHV window 140 can be several inches in size and can be a very delicate optical component that can be easily damaged. In some implementations, the environment outside the UHV environment can be a vacuum environment.

Also shown in the diagram 100a are an outer structure 110 and an inner structure 120 that holds control elements 150 (e.g., high-NA optics). The control elements 150 may include optical elements, microwave antennas, radio frequency elements, and/or compensating magnets, for example, that need to be positioned with great precision with respect to the trap 105.

A holder 130 can be housed within the inner structure 120 to hold the control elements 150 in place within the inner structure 120. The outer structure 110 and the inner structure 120 can be configured as cylinders or have cylindrical shapes such that the inner structure 120 is placed, positioned, or housed inside the outer structure 110. Accordingly, the outer structure 110 may also be referred to as an outer cylinder or outer ring in this example, while the inner structure 120 may also be referred to as an inner cylinder or inner ring.

Figure 1B:
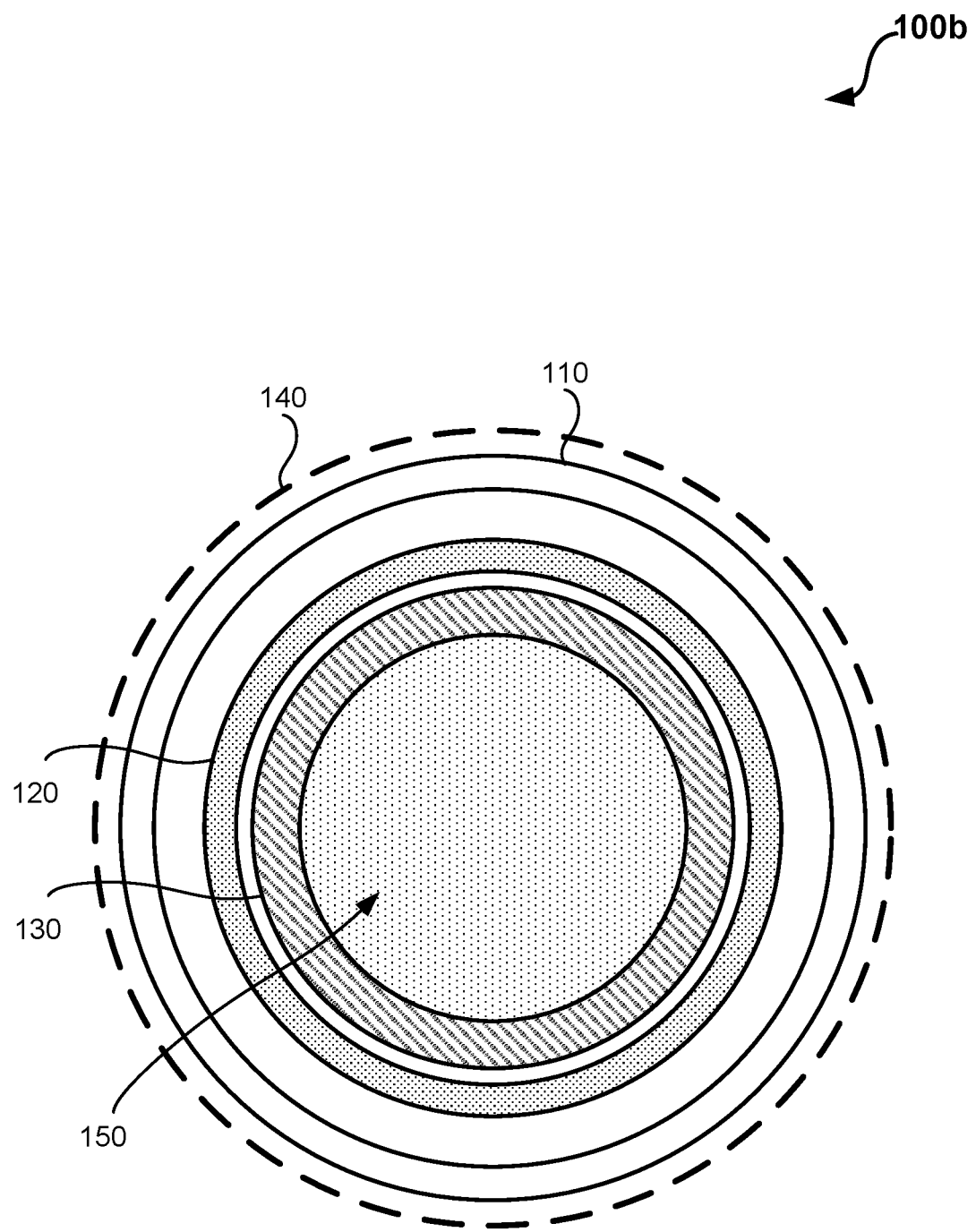
FIG. 1B illustrates a top view of the system of FIG. 1A, in accordance with aspects of the disclosure, in accordance with aspects of the disclosure.

A diagram 100b in FIG. 1B illustrates a top view of the system of the diagram 100a in FIG. 1A. For example, the UHV window 140 (heavy, dashed lines) is shown as a circular window, although it can have different shapes (e.g., square, rectangular). Also shown are the outer structure 110 (shown as a white, outer ring), the inner structure 120 (shown as a shaded ring), the holder 130 (shown as a diagonally patterned ring) with the control elements 150 at the center.

Referring back to the diagram 100a in FIG. 1A, in an implementation, the inner structure 120 with the control elements 150 can be moved for alignment to image and/or illuminate targets or regions of interest (ROIs) 170 such as trapped atoms or ions 107 and/or other targets in 170, such as alignment marks 180 in the trap 105. The movement of the inner structure 120 with the control elements 150 can include movement towards or away from the UHV window 140 and/or lateral movement within the outer structure 110.

To avoid undesirable collisions between the control elements 150 and the UHV window 140, and/or between the control elements 150 and other parts of the overall system, the outer structure 110 and the inner structure 120 are configured such that the inner structure 120 stops moving within the outer structure 110 in response to the inner structure 120 being in physical contact with or within a set proximity (e.g., a pre-determined distance or value) of the outer structure 110. That is, if it is detected that the inner structure 120 is too close or comes into physical contact with the outer structure 110, then the control elements 150 in the inner structure 120 are likely to be too close to the UHV window 140, and consequently, the motion of the inner structure 120 is stopped or suspended to avoid a collision that would damage the UHV window 140.

In one approach, the outer structure 110 and the inner structure 120 can come into physical contact, which may close a circuit (e.g., produce a short circuit) that may then trigger stoppage or suspension of the movement of the inner structure 120. In such an approach, the outer structure 110 can have one or more contacts (e.g., electrical contacts), or it can perform as a contact, and the inner structure 120 can have one or more contacts (e.g., electrical contacts), or it can perform as a contact, such that when a contact of the inner structure 120 touches a contact of the outer structure 110, a circuit is shorted to trigger stoppage or suspension of the movement of the inner structure 120. Movement can subsequently be resumed so long as it is in a direction that would safely avoid collisions with, for example, the UHV window 140.

Figure 2A:
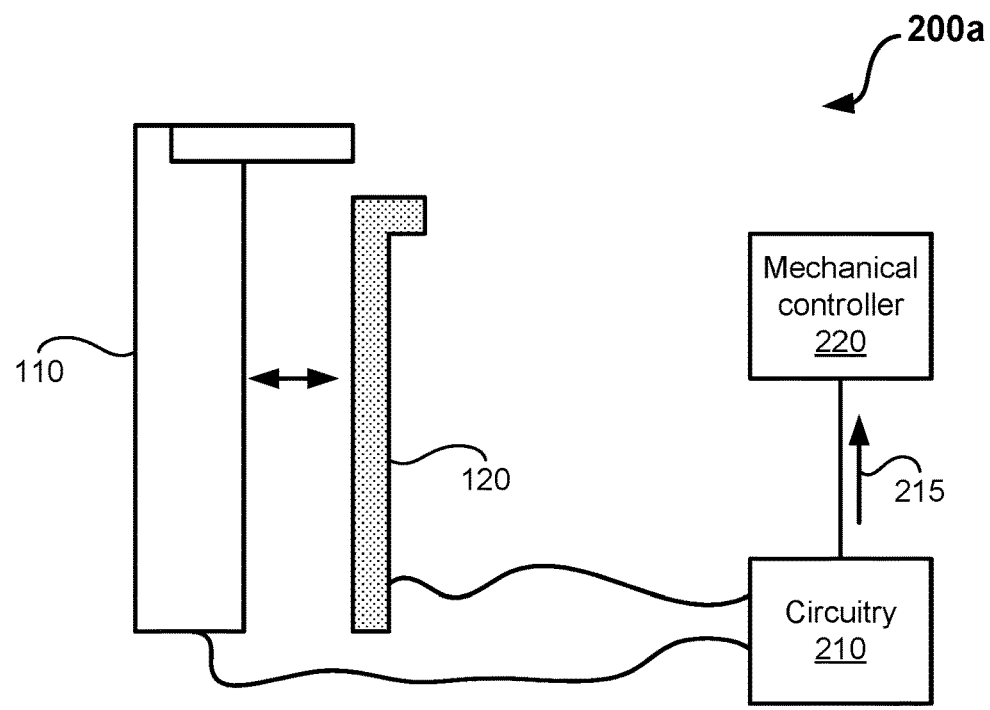
FIGS. 2A and 2B illustrate examples of the operation of the inner and outer structures in the system of FIG. 1A, in accordance with aspects of the disclosure.
Figure 2B:
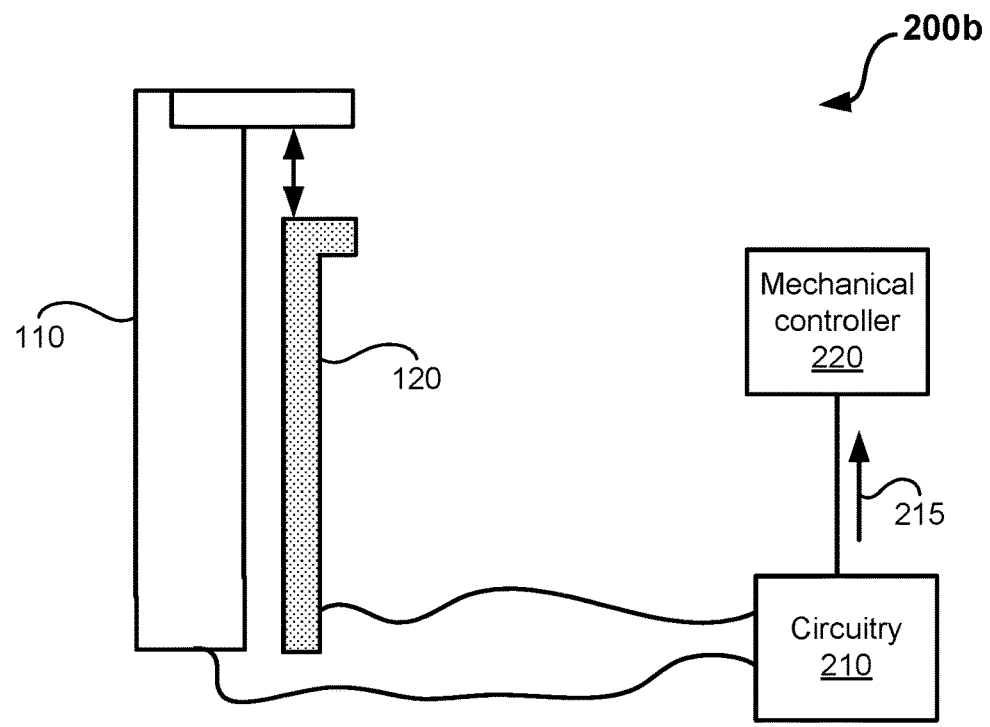

FIGS. 2A and 2B show diagrams 200a and 200b that illustrate examples of the operation of the inner and outer structures in the system of the diagram 100a in FIG. 1A. In these examples, sensitive or fragile optical elements may be attached directly or indirectly to the inner structure 120 (e.g., the control elements 150) and may therefore move with the inner structure 120. In the diagram 200a, the lateral movement of the inner structure 120 can be limited (e.g., to avoid collisions that can damage the sensitive or fragile optical elements) by the presence of the outer structure 110. When the inner structure 120 moves laterally (e.g., for imaging and/or illumination purposes) and touches or makes contact with the outer structure 110, a circuit 210 can detect a short circuit taking place as a result of the contact. The circuit 210 can then generate and provide a signal (or signals) 215 to a mechanical controller 220 or some other device, that is being used to control the movement of the inner structure 120. The signal(s) 215 can indicate to the mechanical controller 220 to stop or suspend the movement (or to move in an opposite direction) in order to avoid a collision that could potentially damage delicate or fragile components. The indication can be in the form of coded information and/or through characteristics of the signal 215 such as amplitude, phase, and/or frequency.

In the diagram 200b, the movement of the inner structure 120 that is perpendicular to the lateral movement can be limited (e.g., to avoid collisions that can damage sensitive or fragile optical elements) by the presence of the outer structure 110. When the inner structure 120 moves vertically (e.g., for imaging and/or illumination purposes) and touches or makes contact with the outer structure 110, the circuit 210 again can detect a short circuit taking place as a result of the contact. The circuit 210 can then generate and provide a signal (or signals) 215 to the mechanical controller 220, or some other device, to indicate to the mechanical controller 220 to stop or suspend the movement (or to move in an opposite direction) in order to avoid a collision that could potentially damage delicate or fragile components.

In the examples of FIGS. 2A and 2B, the outer structure 110 is essentially used as a physical limitation or barrier to avoid the possibility of a collision that can result in the damage of sensitive elements.

Figure 2C:
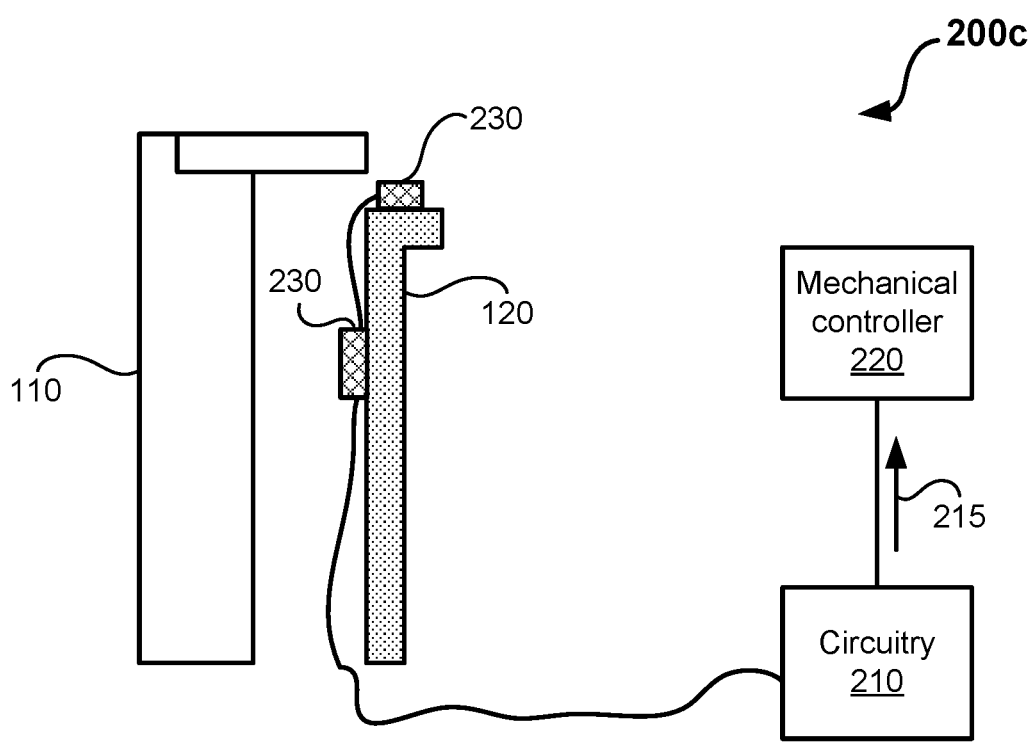
FIG. 2C illustrates operation of the inner and outer structures in the system of FIG. 1A with a proximity sensor, in accordance with aspects of the disclosure.

FIG. 2C shows a diagram 200c that illustrates an alternative configuration in which a proximity sensor 230 (e.g., a capacitive sensor) may be used to trigger the circuit 210 when a distance between two components such as the inner structure 120 and the outer structure 110 is closer than a pre-determined value (e.g., within a set proximity). The proximity sensor 230 may be placed on a side to trigger the circuit 210 when a lateral distance between the structures is too small and/or on top to trigger the circuit 210 when a vertical distance between the structures is too small.

Figure 3A:
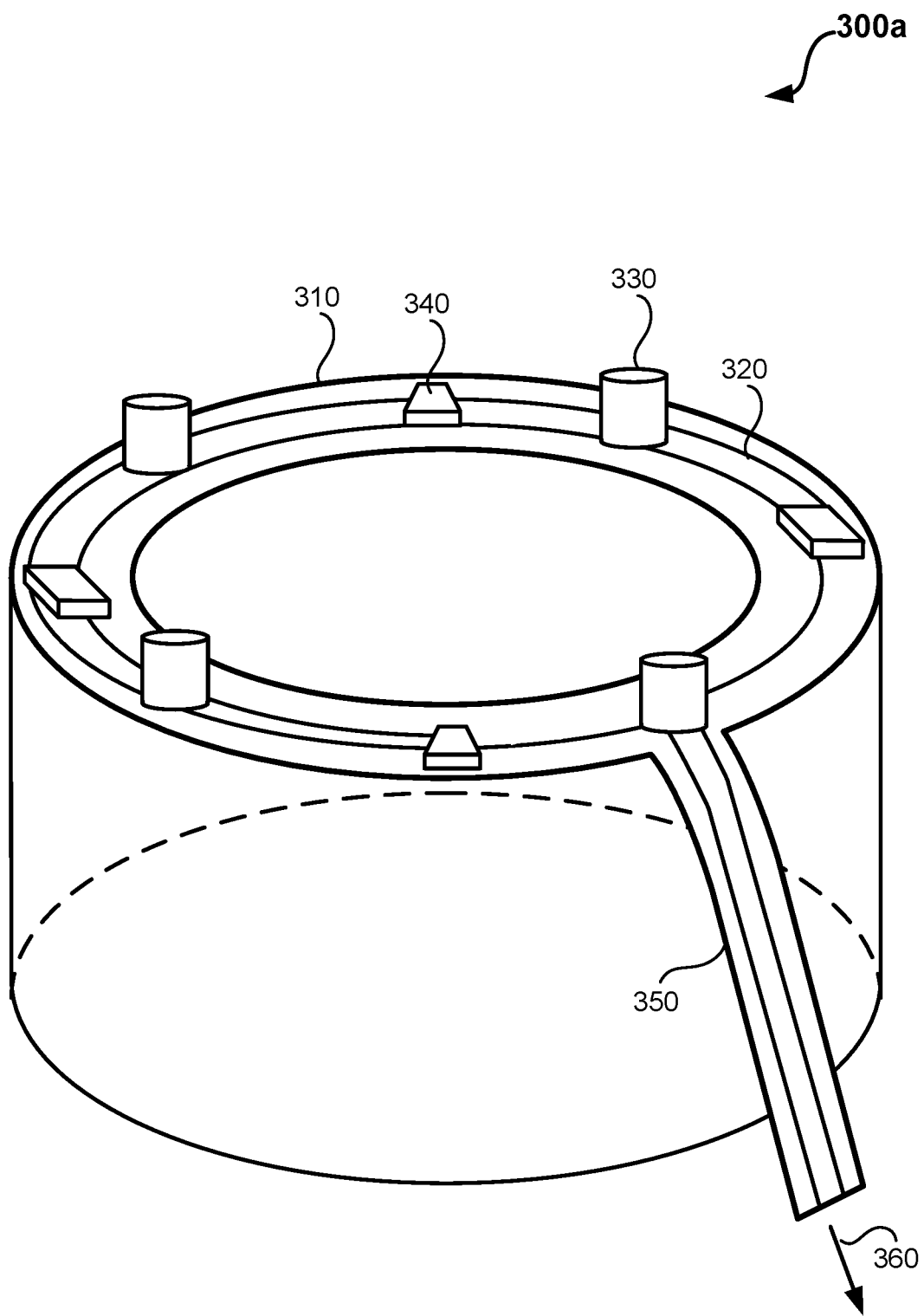
FIG. 3A illustrates an example of a touch sensor having a flexible circuit board and used in a system that interacts with an atom or ion trap, in accordance with aspects of the disclosure.
Figure 3B:
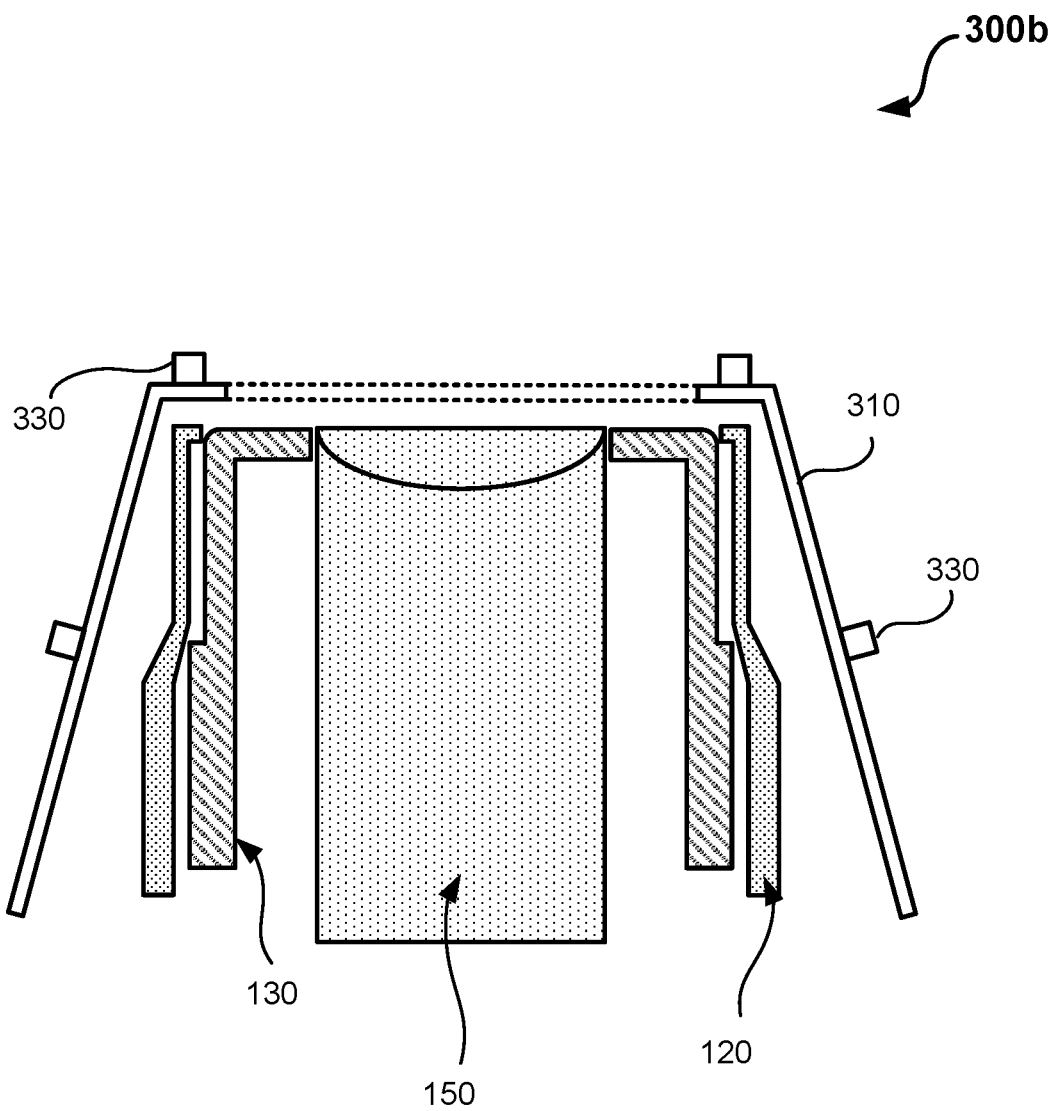
FIGS. 3B-3D illustrate examples of the touch sensor of FIG. 3A over control elements in a system that interacts with an atom or ion trap, in accordance with aspects of the disclosure.

FIGS. 3A and 3B show diagrams 300a and 300b that illustrate an example of a touch sensor having a flexible circuit board 310 and used in a system for light collection and imaging in an atom or ion trap (e.g., the surface trap 105). The touch sensor can be an alternative to or can be combined with some or all of the aspects of the touch sensor described above in connection with the diagram 100a.

For example, as shown in the diagram 300a, the flexible circuit board 310 can be formed into a top portion with a sleeve, jacket, or cover draping to the sides and can have resistive or capacitive rings 320 that change in value due to contact that occurs between the flexible circuit board 310 and another component and/or when spring loaded pins or buttons 330 are pressed as contact occurs between the flexible circuit board 310 and another component. In some implementations, these changes can be detected and/or signaled by components 340 (e.g., circuits or electronic components) on the flexible circuit board 310. In some implementations, the flexible circuit board 310 can have an extension 350 that can be used to enable any of the changes discussed above to be detected by external circuitry via one or more signals 360 provided by the flexible circuit board 310. In some implementations, the flexible circuit board 310 may include just a top portion of what is shown in the diagram 300a (e.g., without the side portion) in which case it may be used as a ring to control vertical movements, while the sleeve or jacket configuration shown in the diagram 300a may allow for control of lateral movements, vertical movements, or both.

In the diagram 300b, a side view shows a possible positioning or arrangement of the flexible circuit board 310 in relation to the holder 130 and the control elements 150. As illustrated in the diagram 300b, the flexible circuit board 310 can be positioned just over the control elements 150 (with the sleeve portion draping to the side of the inner structure 120) and if the control elements 150 (e.g., along with the optical holder 130 and the inner structure 120) get too close to another structure (e.g., the UHV window 140), the rings 320 can change value as a result of contact or the contact can be detected by the spring loaded pins or buttons 330 and/or components 340, and the movement of the control elements 150 can be stopped or suspended as a result of the contact being detected.

Figure 3C:
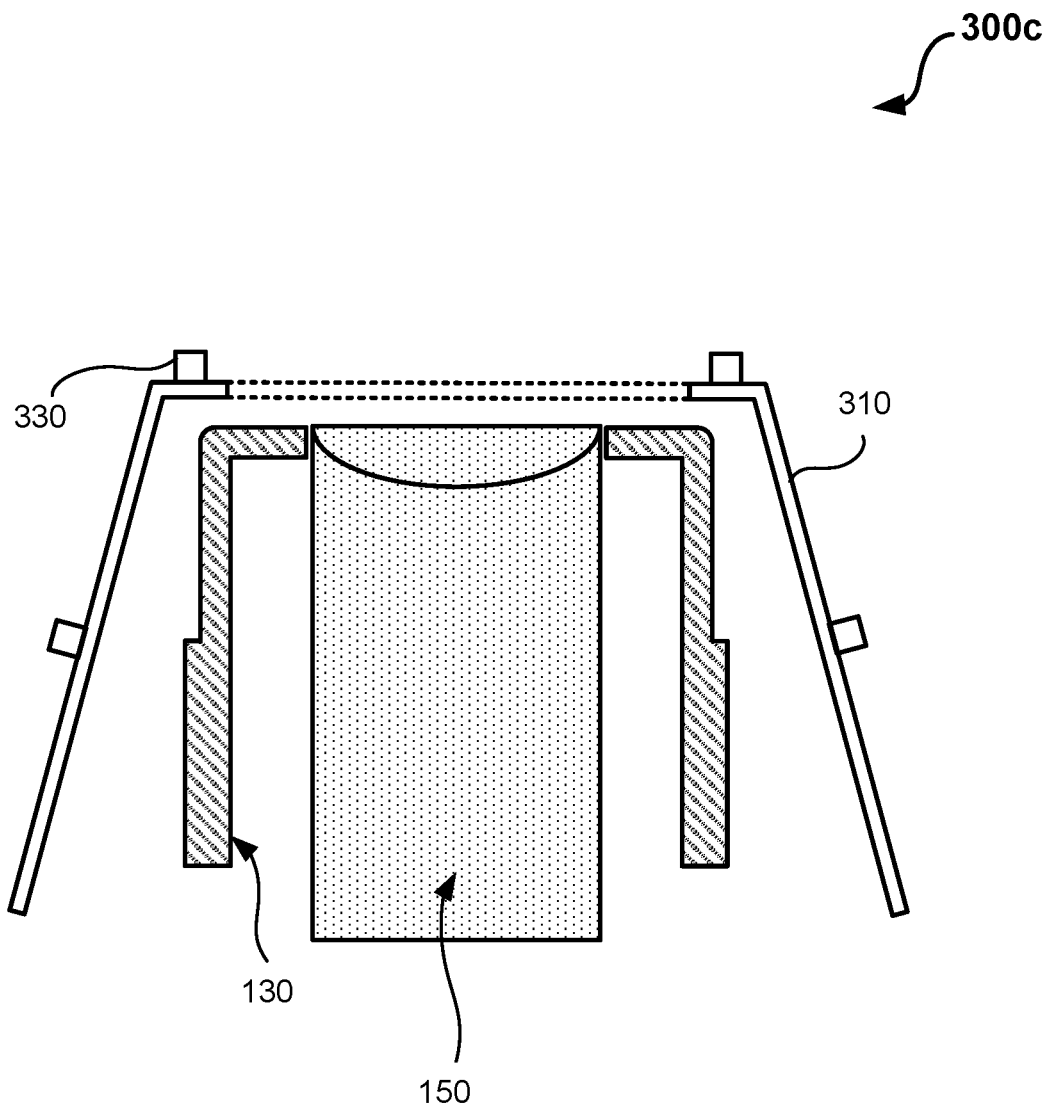

FIG. 3C shows in a diagram 300c an additional implementation in which the inner structure 120, which may serve be used as a contact/proximity sensor 230 in previous descriptions (see e.g., FIGS. 2A and 2B), is replaced by the flexible circuit board 310 and the elements mounted on them. In this example, the flexible circuit board 310 may interact with the outer structure 110, or if the outer structure 110 is not used, with the supporting structure 160.

Figure 3D:
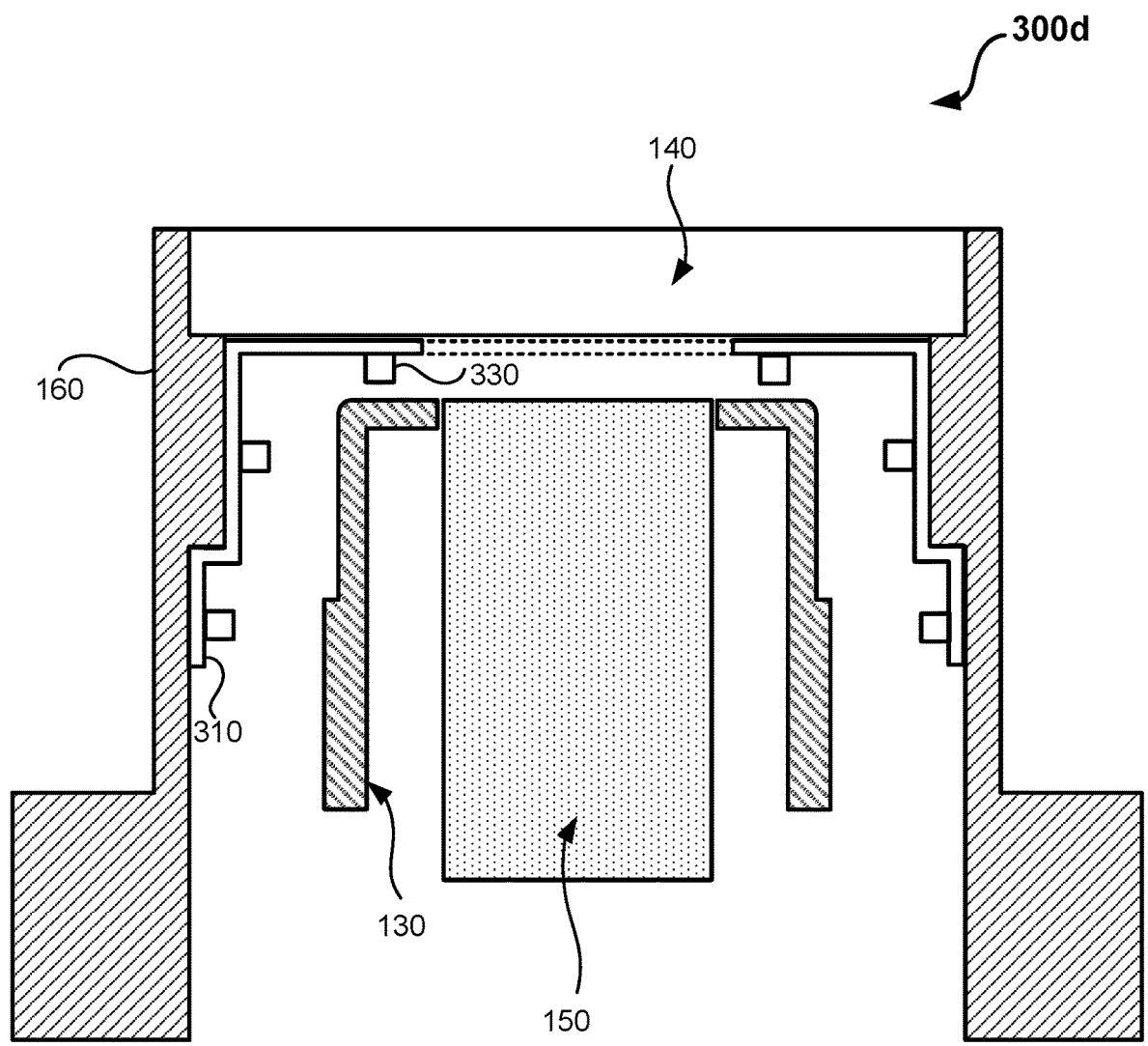

FIG. 3D shows in a diagram 300d an additional implementation in which the flexible circuit board 310 may be placed inside the inner portions of the supporting structure 160 with pins or sensors facing in an inward direction instead of facing an outward direction as in the examples described above. In this case, the inner structure 120 and the outer structure 110 need not be used since the flexible circuit board 310 can interact directly with the holder 130 holding the control elements 150. The flexible circuit board 310 may be placed such that it fits the contour of the inner portions of the supporting structure 160.

One or more contact or proximity sensors 230 can be placed on the inner structure 120, the outer structure 110, or both. In some cases, the flexible circuit board 310 may be conductive such that if the inner structure 120 touches the flexible circuit board 310 it may close a circuit to indicate the contact. In some cases, the flexible circuit board 310 may operate as a flexible version of the outer structure 110, for example.

Figure 4:
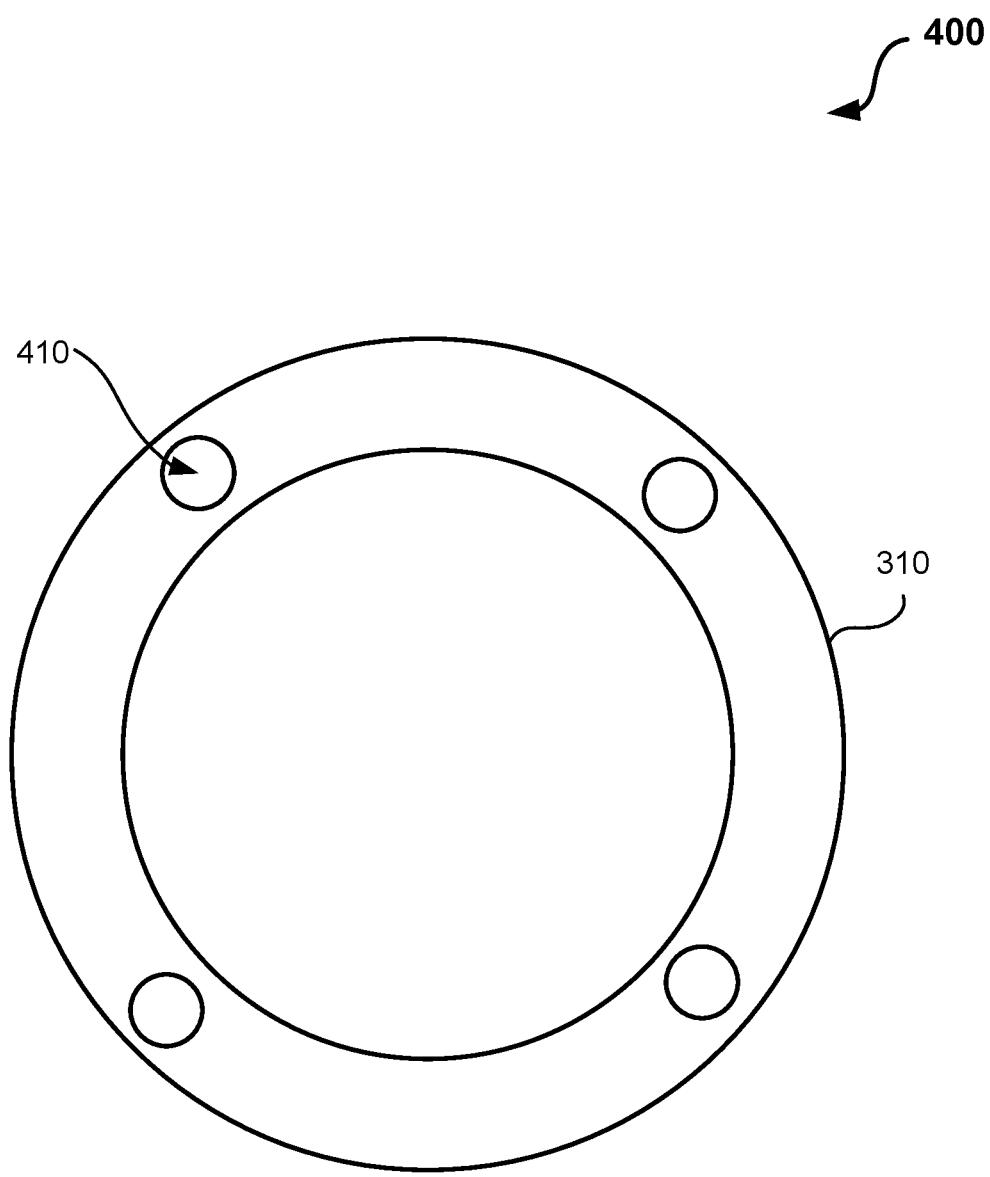
FIG. 4 illustrates an example of light emitting elements in flexible circuit for illuminating a surface ion trap, in accordance with aspects of the disclosure.

In a diagram 400 in FIG. 4 is an example of including light emitting elements 410 (e.g., light emitting diodes (LEDs)) in a flexible circuit for illuminating a surface ion trap. The flexible circuit can be the flexible circuit 310 described above or a different flexible circuit. Accordingly, the use of light emitting elements 410 can be combined with the touch sensors described above, or can be implemented separately from the touch sensors described above. Moreover, it is to be understood that the number (e.g., four) of light emitting elements 410 shown in the example of the diagram 400 is for illustrative purposes only and such a number can be greater or smaller depending on the application. The use of light emitting elements 410 can enhance the imaging and/or illumination features described above. As such, the use of light emitting elements 410 can enhance the detection of targets or ROIs 170 as shown in the diagram 100a in FIG. 1A.

Based on the various implementations and aspects described above, the present disclosure proposes various configurations of a touch sensor and/or illumination for an atom or ion trap used in, for example, a quantum information processing system or some other atomic physics system. In one configuration, a touch sensor is described for controlling movement of optics (e.g., the control elements 150) for use with a trap (e.g., the trap 105), where such a touch sensor can include an outer structure (e.g., the outer structure or ring 110) and an inner structure (e.g., the inner structure or ring 120) that holds the optics and moves within the outer structure. The optics can include a high-numerical aperture (high-NA) imaging lens.

For this touch sensor configuration, the atom or ion trap is placed inside the ultra-high vacuum (UHV) environment, and the outer structure and the inner structure are placed outside the UHV environment and separated from the UHV environment by a UHV window (e.g., the UHV or optical window 140), the inner structure with the optics being brought into proximity of the vacuum window in connection with imaging or illumination of one or more targets at the atom or ion trap, as illustrated in the diagram 100a in FIG. 1A. The outer structure and the inner structure can be configured such that the inner structure stops moving within the outer structure to avoid damaging of the vacuum window with the optics and in response to the inner structure being in physical contact with or within a set proximity of the outer structure (see e.g., FIGS. 2A, 2B and 2C).

For this touch sensor configuration, the outer structure can be an outer cylindrical structure and the inner structure can be an inner cylindrical structure. The inner structure can be configured to move within the outer structure in a longitudinal direction, a lateral direction, a tilt direction about a longitudinal axis, a rotational direction about the longitudinal axis, or a combination thereof. The longitudinal direction can include moving towards the vacuum window or away from the vacuum window. For example, the inner structure is moved in the longitudinal direction, the lateral direction, the tilt direction, the rotational direction, or a combination thereof to image the one or more targets (e.g., the targets 170 as shown in the diagram 100a) at the atom or ion trap, where the one or more targets of the trap includes one or more ions of the trap (e.g., ions 107), one or more registration marks of the trap (e.g., registration marks 180), or both.

For this touch sensor configuration, the outer structure includes or operates as a first contact, the inner structure includes or operates as a second contact, and the inner structure is configured to stop moving within the outer structure in response to the second contact of the inner structure being in physical contact or proximity with the first contact of the outer structure (see e.g., FIGS. 2A and 2B). A system having the touch sensor can also include circuitry (e.g., the circuitry 210) connected to the first contact and the second contact and configured to detect a short circuit between the first contact and the second contact when in physical contact with each other, the circuitry further configured to generate and send a signal (e.g., the signal 215) to a mechanical device (e.g., the mechanical controller 220) that moves the inner structure to stop moving the inner structure in response to the detection of the short circuit.

For this touch sensor configuration, a proximity sensor (see e.g., FIG. 2C) can be used (either with the inner structure or the outer structure, to detect when the inner structure is in physical contact with or within a set proximity of the outer structure and to generate a signal to stop movement of the inner structure with the one or more control elements to avoid damaging of the UHV window.

In another touch sensor configuration, the touch sensor can include, additionally or alternatively to the inner structure or outer structure, a flexible circuit board that indicates whether the optics have been moved to a position that can cause collisions (e.g., the flexible circuit 310). In one non-limiting example, the flexible circuit board can be positioned with the inner structure described above (e.g., can be attached to the inner structure or can be part of the inner structure) and the flexible circuit can provide a signal (e.g., the signal 360) indicating that the inner structure is in physical contact with or within a set proximity of the outer structure or some other structure.

For this touch sensor configuration, the flexible circuit board can be ring-shaped (see e.g., the diagram 300a in FIG. 3A) and can be placed on an end of the inner structure closest to the UHV window, where the flexible circuit board can have one or more resistive or capacitive rings (e.g., the rings 320) that change value in response to the inner structure being in physical contact with or within a set proximity of the outer structure. An amount of change in the value of the one or more resistive or capacitive rings is different when the inner structure is in physical contact with the outer structure (or some other structure) than when the inner structure is within a set proximity of the outer structure (or some other structure). The actions taken may be different based on the amount of change where, for example, the motion of the inner structure and/or the optics can be slowed down or reduced when within a set proximity (e.g., a certain, pre-determined distance) and can be immediately stopped or suspended when in physical contact. The flexible circuit board can include contact or spring loaded pins (e.g., contacts or spring loaded pins 330) configured to detect when the inner structure is in physical contact with or within a set proximity of the outer structure and change the value of the one or more resistive or capacitive rings. Moreover, circuitry (e.g., the components 340) can be connected to the one or more resistive or capacitive rings and configured to generate a signal in response to a change in the value of the one or more resistive or capacitive rings, the circuitry further configured to send the signal to a mechanical device that moves the inner structure to stop moving the inner structure.

In another touch sensor configuration, the flexible circuit board can include one or more light emitting elements (e.g., LEDs) configured to illuminate one or more targets (e.g., the ions 107, the registration marks 180) at the atom or ion trap. In this configuration, the flexible circuit board can be ring-shaped, and the one or more light emitting elements can be positioned on an inner radius portion of the ring-shaped flexible circuit board.

In yet another touch sensor configuration, the touch sensor can include a holder configured to hold the one or more control elements and to move with respect to the atom or ion trap, wherein the atom or ion trap is placed inside a UHV environment, and the holder is placed outside the UHV environment and separated from the UHV environment by a UHV window, the holder with the one or more control elements being brought into proximity of the UHV window in connection with control of one or more targets at the atom or ion trap; and a flexible circuit board that is ring-shaped and placed on an end of the holder closest to the UHV window (see e.g., the diagram 300c FIG. 3C), the flexible circuit board having one or more resistive or capacitive rings that change value in response to the one or more control elements being in physical contact with or within a set proximity of the UHV window.

The various configurations of a touch sensor described above are not intended to be limiting but illustrative of the various features and possible, non-exhaustive combinations of those features. Accordingly, based on the description provided in this disclosure, other configurations can be implemented that are within the scope of the teachings of this disclosure.

Figure 5:
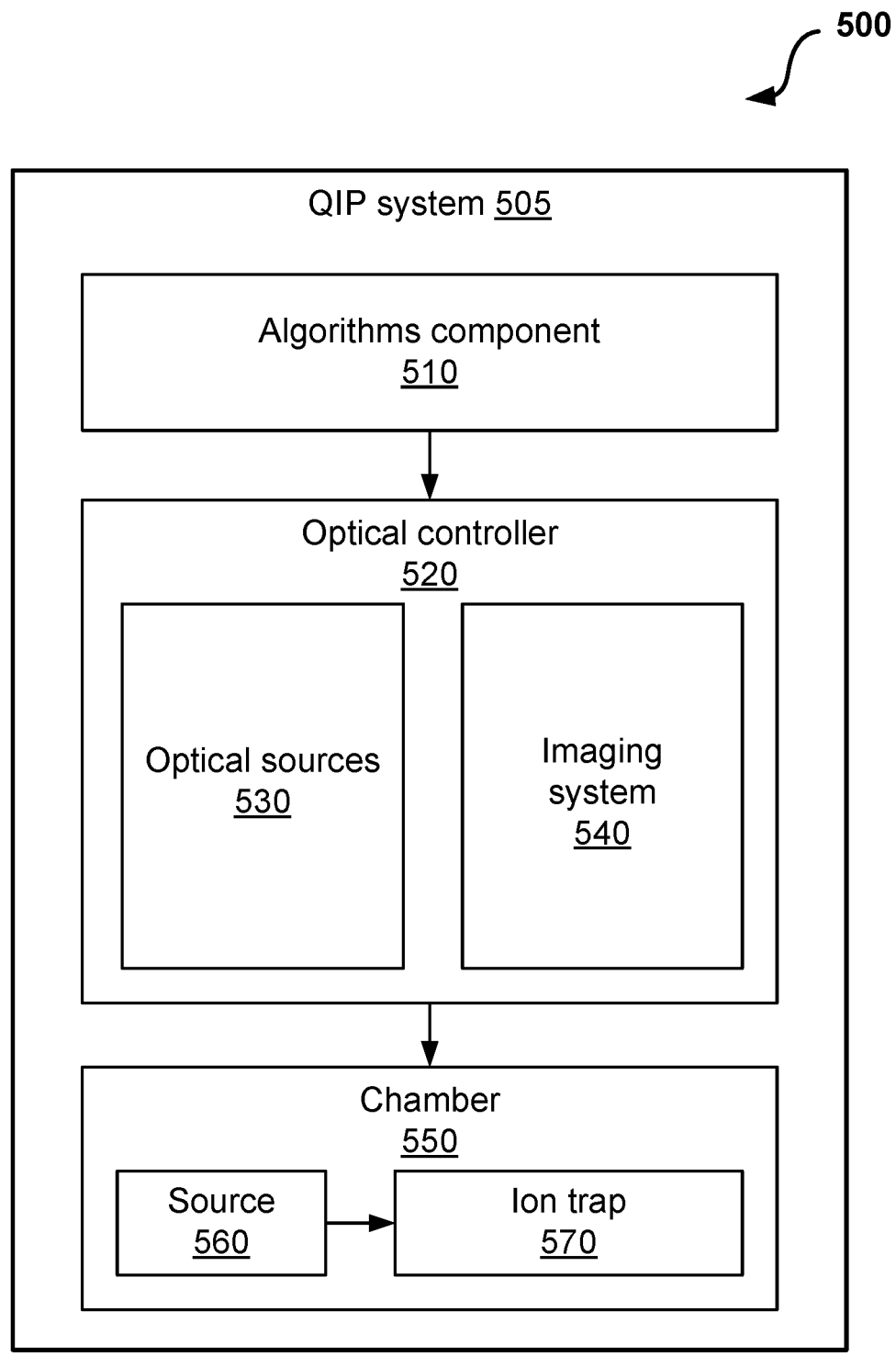
FIG. 5 is a block diagram that illustrates an example of a quantum information processing (QIP) system, in accordance with aspects of this disclosure.

FIG. 5 is a block diagram 500 that illustrates an example of a QIP system 505 in accordance with aspects of this disclosure. The QIP system 505 may also be referred to as a quantum computing system, a computer device, or the like. In an aspect, the QIP system 505 may correspond to portions of a quantum computer implementation of the computing device 700 in FIG. 7.

The QIP system 505 can include a source 560 that provides atomic species (e.g., a flux of neutral atoms) to a chamber 550 having an ion trap 570 (e.g., a surface trap) that traps the atomic species once ionized (e.g., photoionized) by an optical controller 520. The source 560 may be part of the chamber 550 and can include a thermal atom source or atomic oven source to produce a flux. Optical sources 530 in the optical controller 520 may include one or more laser sources that can be used for ionization of the atomic species, control (e.g., phase control) of the atomic ions, for fluorescence of the atomic ions that can be monitored and tracked by image processing algorithms operating in an imaging system 540 in the optical controller 520, and/or the overall control of the atomic ions during various operations. The imaging system 540 can include a high resolution imager (e.g., CCD camera) for monitoring the atomic ions while they are being provided to the ion trap 570 (e.g., for counting) or after they have been provided to the ion trap 570 (e.g., for monitoring the atomic ions states). In an aspect, the imaging system 540 can be implemented separate from the optical controller 520, however, operation of the imaging system 540 may need to be coordinated with the optical controller 520. The imaging system 540 may include one or more of the components and/or touch sensor features and configurations described above in connection with in FIGS. 1A-4 for bounding the range of movement of the high-NA optics to prevent collision as well as adding wide-field illumination for alignment and imaging.

The QIP system 505 may also include an algorithms component 510 that may operate with other parts of the QIP system 505 (not shown) to perform quantum algorithms or quantum operations. As such, the algorithms component 510 may provide instructions to various components of the QIP system 505 (e.g., to the optical controller 520) to enable the implementation of the quantum algorithms or quantum operations.

Figure 6:
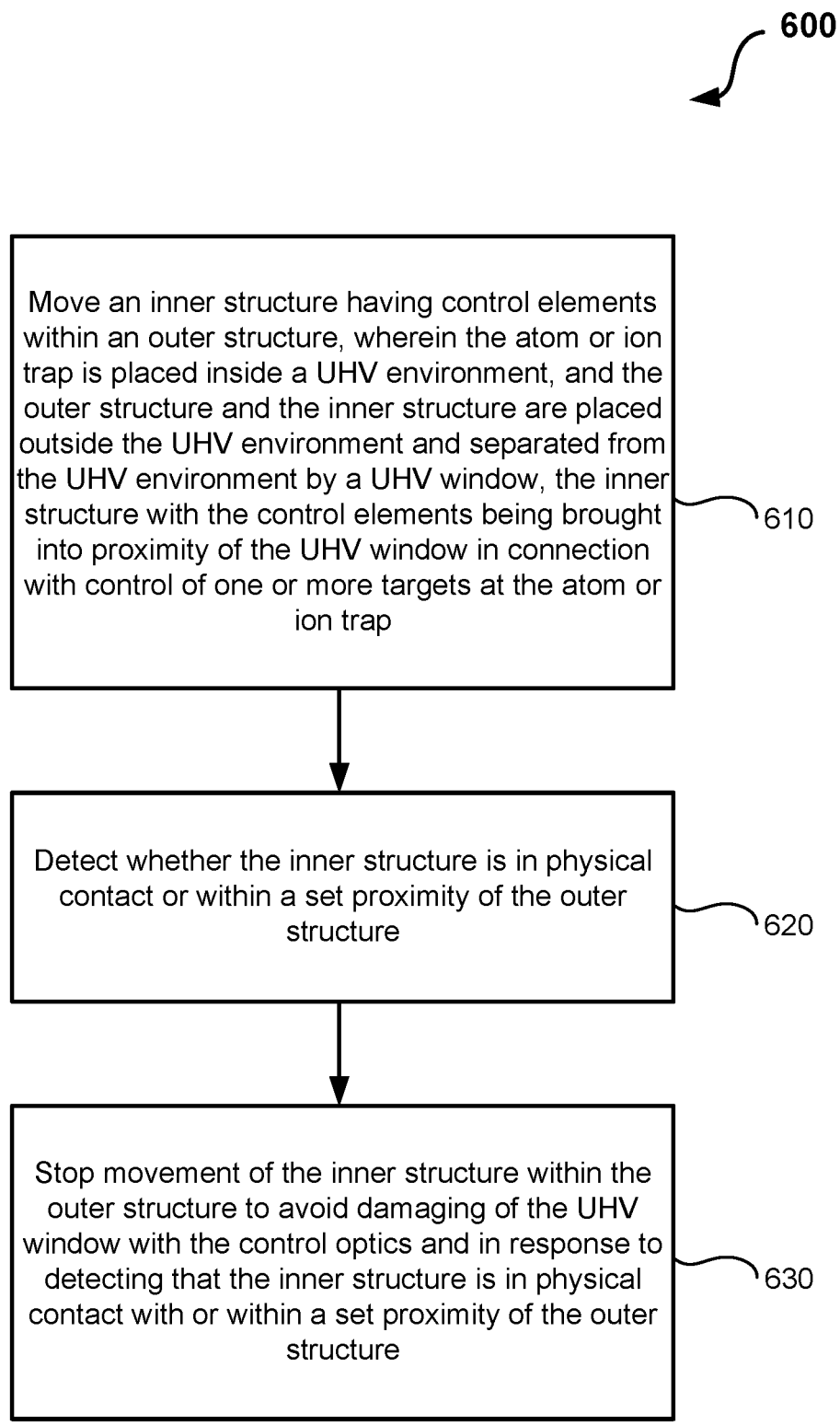
FIG. 6 is a flow chart that illustrates an example of a method for controlling movement of control elements for use with an atom or ion trap, in accordance with aspects of this disclosure.

FIG. 6 is a flow diagram that illustrates an example of a method 600 for controlling movement of one or more control elements for use with an atom or ion trap (e.g., the trap 105 or the ion trap 570). In an aspect, the method 600 may be performed in a computer system such as the computer system 700 described below. Similarly, the functions of the method 600 may be performed by one or more components of a QIP system such as the QIP system 505 and its components, where the QIP system can include an ion trap. For example, the method 600 may be performed in connection with the chamber 550, the ion trap 570, and/or the imaging system 540 in FIG. 5.

At 610, the method 600 includes moving an inner structure (e.g., the inner structure or ring 120) having the control elements (e.g., the control elements 150) within an outer structure (e.g., the outer structure or ring 110), wherein the trap is placed inside UHV environment, and the outer structure and the inner structure are placed outside the UHV environment and separated from the UHV environment by a UHV window (e.g., the UHV or optical window 140), the inner structure with the control elements being brought into proximity of the UHV window in connection with control (e.g., imaging or illumination) of one or more targets (e.g., the ions 107, the registration marks 180) at the trap.

At 620, the method 600 includes detecting whether the inner structure is in physical contact or within a set proximity of the outer structure (see e.g., FIGS. 2A, 2B, and 2C).

At 630, the method 600 includes stopping movement of the inner structure within the outer structure to avoid damaging of the UHV (e.g., optical) window with the control elements and in response to detecting that the inner structure is in physical contact with or within a set proximity of the outer structure (see e.g., FIGS. 2A, 2B, and 2C).

In an aspect of the method 600, stopping the movement of the inner structure includes generating, in response to detecting that the inner structure is in physical contact with or within a set proximity of the outer structure, a signal to a mechanical driver (e.g., the signal 215 sent to the mechanical controller 220 by the circuitry 210) that moves the inner structure to stop the movement of the inner structure.

In aspect of the method 600, the one or more targets include one or more registration marks of the trap, the method further comprising illuminating, with one or more light emitting elements on a flexible circuit board on the inner structure, the one or more registration marks to align the optics with the one or more registration marks. A similar approach may be used when a flexible circuit board is used without the need of the inner structure (see e.g., FIG. 3C—this configuration applies to contact/proximity detection using the pins or buttons 330 as well as illumination using the light emitting elements 410 in the diagram 400 in FIG. 4).

Figure 7:
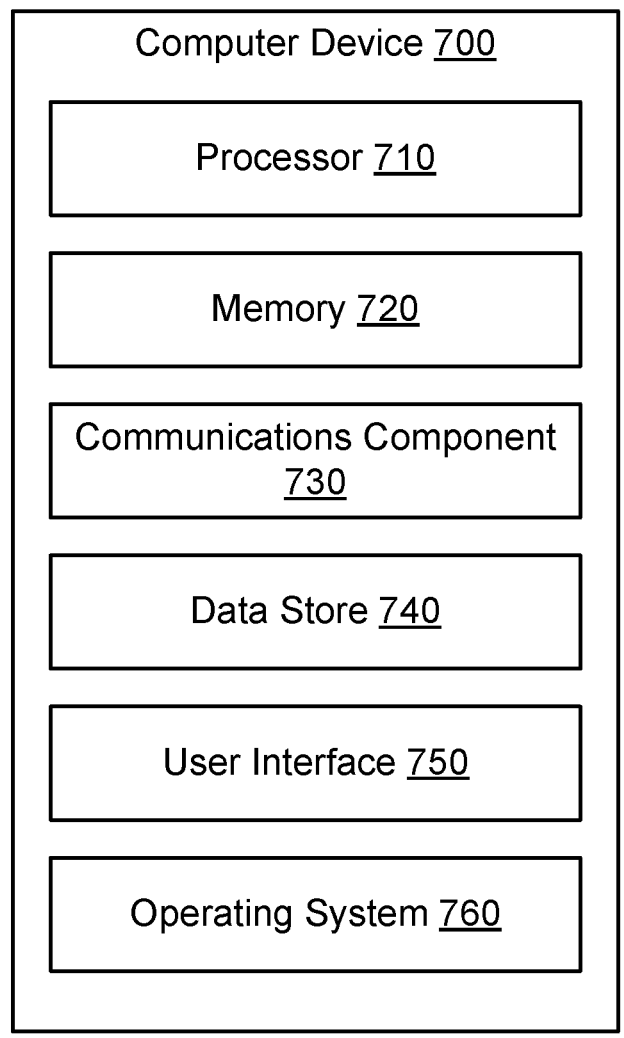
FIG. 7 is a block diagram that illustrates an example of computer device used as a QIP system or in connection with a QIP system, in accordance with aspects of the disclosure.

Referring now to FIG. 7, illustrated is an example computer device 700 in accordance with aspects of the disclosure. The computer device 700 can represent a single computing device, multiple computing devices, or a distributed computing system, for example. The computer device 700 may be configured as a quantum computer, a classical computer, or a combination of quantum and classical computing functions. As described above, the QIP system 505 may be an example of at least a portion of the computer device 700.

In one example, the computer device 700 may include a processor 710 for carrying out processing functions associated with one or more of the features described herein. The processor 710 may include a single or multiple set of processors or multi-core processors. Moreover, the processor 710 may be implemented as an integrated processing system and/or a distributed processing system. The processor 710 may include a central processing unit (CPU), a quantum processing unit (QPU), a graphics processing unit (GPU), a field-programmable gate array (FPGA), or combination of those types of processors. In one aspect, the processor 710 may refer to a general processor of the computer device 700, which may also include additional processors 710 to perform more specific functions such as control of the operations associated with preventing collisions of optical elements in connection with imaging and illumination of atom or ion traps, for example.

In an example, the computer device 700 may include a memory 720 for storing instructions executable by the processor 710 for carrying out the functions described herein. In an implementation, for example, the memory 720 may correspond to a computer-readable storage medium that stores code or instructions to perform one or more of the functions or operations described herein. In one example, the memory 720 may include instructions to perform and/or control aspects of a method 600 described below in connection with FIG. 6. Just like the processor 710, the memory 720 may refer to a general memory of the computer device 700, which may also include additional memories 720 to store instructions and/or data for more specific functions such as instructions and/or data for control of the operations associated with preventing collisions of optical elements in connection with imaging and illumination of atom or ion traps, for example.

Further, the computer device 700 may include a communications component 730 that provides for establishing and maintaining communications with one or more parties utilizing hardware, software, and services as described herein. The communications component 730 may carry communications between components on the computer device 700, as well as between the computer device 700 and external devices, such as devices located across a communications network and/or devices serially or locally connected to computer device 700. For example, the communications component 500 may include one or more buses, and may further include transmit chain components and receive chain components associated with a transmitter and receiver, respectively, operable for interfacing with external devices.

Additionally, the computer device 700 may include a data store 740, which can be any suitable combination of hardware and/or software, that provides for mass storage of information, databases, and programs employed in connection with implementations described herein. For example, the data store 740 may be a data repository for operating system 760 (e.g., classical OS, or quantum OS). In one implementation, the data store 740 may include the memory 720.

The computer device 700 may also include a user interface component 750 operable to receive inputs from a user of the computer device 700 and further operable to generate outputs for presentation to the user or to provide to a different system (directly or indirectly). The user interface component 750 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 750 may include one or more output devices, including but not limited to a display, a speaker, a haptic feedback mechanism, a printer, any other mechanism capable of presenting an output to a user, or any combination thereof.

In an implementation, the user interface component 750 may transmit and/or receive messages corresponding to the operation of the operating system 760. In addition, the processor 510 may execute the operating system 760 and/or applications or programs, and the memory 720 or the data store 740 may store them.

When the computer device 700 is implemented as part of a cloud-based infrastructure solution, the user interface component 750 may be used to allow a user of the cloud-based infrastructure solution to remotely interact with the computer device 700.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A touch sensor for controlling movement of one or more control elements for use with an atom or ion trap, comprising:
   an outer structure; and
   an inner structure configured to hold the one or more control elements and to move within the outer structure,
   wherein the atom or ion trap is placed inside an ultra-high vacuum (UHV) environment, and the outer structure and the inner structure are placed outside the UHV environment and separated from the UHV environment by a UHV window, the inner structure with the one or more control elements being brought into proximity of the UHV window in connection with control of one or more targets at the atom or ion trap, and
   wherein the outer structure and the inner structure are configured such that the inner structure stops moving within the outer structure to avoid damaging of the UHV window with the one or more control elements and in response to the inner structure being in physical contact with or within a set proximity of the outer structure.

2. The touch sensor of claim 1, wherein the one or more control elements include one or more optical elements.

3. The touch sensor of claim 2, wherein control of the one or more targets includes imaging of the one or more targets using the one or more optical elements.

4. The touch sensor of claim 2, wherein control of the one or more targets includes application of control optical beams to the one or more targets using the one or more optical elements.

5. The touch sensor of claim 1, wherein the one or more control elements include one or more microwave antennas.

6. The touch sensor of claim 1, wherein the one or more control elements include one or more compensating magnets.

7. The touch sensor of claim 1, wherein the atom or ion trap is a surface trap, a three-dimensional (3D) ion trap, or an optical trap.

8. The touch sensor of claim 1, wherein the outer structure is an outer cylindrical structure and the inner structure is an inner cylindrical structure.

9. The touch sensor of claim 1, wherein the one or more control elements include a high-numerical aperture imaging lens.

10. The touch sensor of claim 1, wherein the inner structure is configured to move within the outer structure in a longitudinal direction, a lateral direction, a tilt direction, a rotational direction, or a combination thereof.

11. The touch sensor of claim 10, wherein the longitudinal direction includes moving towards the UHV window or away from the UHV window.

12. The touch sensor of claim 10, wherein the inner structure is moved in the longitudinal direction, the lateral direction, the tilt direction, the rotational direction, or a combination thereof to image the one or more targets at the atom or ion trap.

13. The touch sensor of claim 12, wherein the one or more targets of the atom or ion trap includes one or more ions of the atom or ion trap, one or more registration marks of the atom or ion trap, or both.

14. The touch sensor of claim 1, further comprising a proximity sensor that detects when the inner structure is in physical contact with or within a set proximity of the outer structure and generates a signal to stop the inner structure with the one or more control elements to avoid damaging of the UHV window.

15. The touch sensor of claim 1, wherein:
   the outer structure includes or operates as a first contact,
   the inner structure includes or operates as a second contact, and
   the inner structure is configured to stop moving within the outer structure in response to the second contact of the inner structure being in physical contact with the first contact of the outer structure.

16. The touch sensor of claim 15, further comprising circuitry connected to the first contact and the second contact and configured to detect a short circuit between the first contact and the second contact when in physical contact with each other, the circuitry further configured to send a signal to a mechanical device that moves the inner structure to stop moving the inner structure in response to the detection of the short circuit.

17. The touch sensor of claim 1, wherein the inner structure includes a flexible circuit board that provides a signal indicating that the inner structure is in physical contact with or within a set proximity of the outer structure.

18. The touch sensor of claim 17, wherein:
   the outer structure is an outer cylindrical structure,
   the inner structure is an inner cylindrical structure, and
   the flexible circuit board is ring-shaped and placed on an end of the inner structure closest to the UHV window, the flexible circuit board having one or more resistive or capacitive rings that change value in response to the inner structure being in physical contact with or within a set proximity of the outer structure.

19. The touch sensor of claim 18, wherein an amount of change in the value of the one or more resistive or capacitive rings is different when the inner structure is in physical contact with the outer structure than when the inner structure is within a set proximity of the outer structure.

20. The touch sensor of claim 18, wherein the flexible circuit board further includes contact or spring loaded pins configured to detect when the inner structure is in physical contact with or within a set proximity of the outer structure and change the value of the one or more resistive or capacitive rings.

21. The touch sensor of claim 18, further comprising circuitry connected to the one or more resistive or capacitive rings and configured to generate a signal in response to a change in the value of the one or more resistive or capacitive rings, the circuitry further configured to send the signal to a mechanical device that moves the inner structure to stop moving the inner structure.

22. The touch sensor of claim 17, wherein the flexible circuit board includes one or more light emitting elements configured to illuminate the one or more targets at the atom or ion trap.

23. The touch sensor of claim 22, wherein:
the outer structure is an outer cylindrical structure,
the inner structure is an inner cylindrical structure, and
the flexible circuit board is ring-shaped, the one or more light emitting elements positioned on an inner radius portion of the ring-shaped flexible circuit board.

24. The touch sensor of claim 22, wherein the one or more targets at the atom or ion trap include one or more registration marks, the one or more registration marks enabling alignment of the one or more control elements to the one or more registration marks.

25. A method for controlling movement of one or more control elements for use with an atom or ion trap, comprising:
moving an inner structure having the one or more control elements within an outer structure, wherein the atom or ion trap is placed inside an ultra-high vacuum (UHV) environment, and the outer structure and the inner structure are placed outside the UHV environment and separated from the UHV environment by a UHV window, the inner structure with the one or more control elements being brought into proximity of the UHV window in connection with control of one or more targets at the atom or ion trap;
detecting whether the inner structure is in physical contact or within a set proximity of the outer structure; and
stopping movement of the inner structure within the outer structure to avoid damaging of the UHV window with the one or more control elements and in response to detecting that the inner structure is in physical contact with or within a set proximity of the outer structure.

26. The method of claim 25, wherein the one or more control elements include one or more of:
one or more optical elements,
one or more microwave antennas, or
one or more compensating magnets.

27. The method of claim 26, wherein when the one or more control elements include one or more optical elements, the method further includes one or both of:
imaging of the one or more targets using the one or more optical elements, or
applying control optical beams to the one or more targets using the one or more optical elements.

28. The method of claim 25, wherein the atom or ion trap is a surface trap, a three-dimensional (3D) ion trap, or an optical trap.

29. The method of claim 25, wherein stopping the movement of the inner structure comprises generating, in response to detecting that the inner structure is in physical contact with or within a set proximity of the outer structure, a signal to a mechanical driver that moves the inner structure to stop the movement of the inner structure.

30. The method of claim 25, wherein the one or more targets include one or more registration marks of the atom or ion trap, the method further comprising illuminating, with one or more light emitting elements on a flexible circuit board on the inner structure, the one or more registration marks to align the one or more control elements with the one or more registration marks.

31. The method of claim 25, wherein moving the inner structure includes moving the inner structure within the outer structure in a longitudinal direction, a lateral direction, a tilt direction, a rotational direction, or a combination thereof.

32. A touch sensor for controlling movement of one or more control elements for use with an atom or ion trap, comprising:
a holder configured to hold the one or more control elements and to move with respect to the atom or ion trap, wherein the atom or ion trap is placed inside an ultra-high vacuum (UHV) environment, and the holder is placed outside the UHV environment and separated from the UHV environment by a UHV window, the holder with the one or more control elements being brought into proximity of the UHV window in connection with control of one or more targets at the atom or ion trap; and
a flexible circuit board that is ring-shaped and placed on an end of the holder closest to the UHV window, the flexible circuit board having one or more resistive or capacitive rings that change value in response to the one or more control elements being in physical contact with or within a set proximity of the UHV window.

* * * * *